(12) United States Patent
Thomas et al.

(10) Patent No.: US 6,379,406 B1
(45) Date of Patent: Apr. 30, 2002

(54) POLISHING COMPOSITIONS FOR SEMICONDUCTOR SUBSTRATES

(75) Inventors: Terence M. Thomas, Newark; Craig D. Lack, Wilmington; Steven P. Goehringer, Newark, all of DE (US)

(73) Assignee: Rodel Holdings, Inc., Wilmington, DE (US)

( * ) Notice: Subject to any disclaimer, the term of this patent is extended or adjusted under 35 U.S.C. 154(b) by 0 days.

(21) Appl. No.: 09/734,095

(22) Filed: Dec. 11, 2000

Related U.S. Application Data

(60) Provisional application No. 60/170,612, filed on Dec. 14, 1999.

(51) Int. Cl.[7] .............................. C09K 3/14; C09G 1/02; C09G 1/04
(52) U.S. Cl. .............................. 51/309; 51/307; 51/308; 106/3; 438/692; 438/693
(58) Field of Search .......................... 51/307, 308, 309; 106/3; 438/692, 693; 451/36, 60

(56) References Cited

U.S. PATENT DOCUMENTS

| | | | |
|---|---|---|---|
| 4,956,015 A | * | 9/1990 | Okajima et al. ............... 51/309 |
| 4,959,113 A | | 9/1990 | Roberts |
| 5,366,542 A | | 11/1994 | Yamada et al. |
| 5,868,604 A | | 2/1999 | Atsugi et al. |
| 6,241,586 B1 | * | 6/2001 | Yancey ...................... 51/309 |
| 6,258,140 B1 | * | 7/2001 | Shemo et al. ................. 106/3 |

OTHER PUBLICATIONS

Kaufman et al.; "Chemical–Mechanical Polishing for Fabricating Patterned W Metal Features as Chip Interconnects"; Journal of the Electrochemical Society; Nov., 1991; pp. 3460–3464; vol. 138. No. 11; The Electrochemical Society, Inc.

* cited by examiner

*Primary Examiner*—Michael Marcheschi
(74) *Attorney, Agent, or Firm*—Gerald K. Kita; Konrad Kaeding; Kenneth A. Benson

(57) ABSTRACT

This invention provides a polishing composition with a stable pH for use in CMP of semiconductor substrates comprising: high-purity submicron particles of a metal oxide and a soluble metal salt of the metal oxide. The metal salt is present in a proportionate amount to adjust the aqueous concentration of metal ions to the equilibrium solubility of the metal oxide at the desired pH of the polishing composition.

14 Claims, 2 Drawing Sheets

POLISHING COMPOSITIONS FOR SEMICONDUCTOR SUBSTRATES

This utility application claims the benefit of U.S. Provisional Patent Application No. 60/170,612 filed on Dec. 14, 1999.

The present invention relates to high purity abrasive particles comprising metal oxide for use in chemical-mechanical polishing compositions (or slurries). Polishing compositions or slurries used for chemical mechanical polishing (CMP) typically comprise an aqueous solution which contains abrasive particles, an oxidizing agent, a dispersant and/or a complexing agent. The abrasive particles are typically sub-micron in size.

U.S. Pat. No. 4,959,113 discloses an aqueous polishing composition containing alumina particles and aluminum nitrate that is added to the aqueous polishing composition to improve the polishing efficiency of the alumina particles.

This invention provides an aqueous polishing composition for polishing semiconductor substrates comprising sub-micron particles of a metal oxide and a soluble metal salt of the metal oxide. The soluble metal salt is present in a proportionate amount to adjust the aqueous concentration of metal ions to the equilibrium solubility of the metal oxide at the desired pH of the polishing composition thus providing an aqueous polishing composition having a stable pH.

Embodiments of the invention will now be described by way of example with reference to the accompanying drawings.

Figure 1:
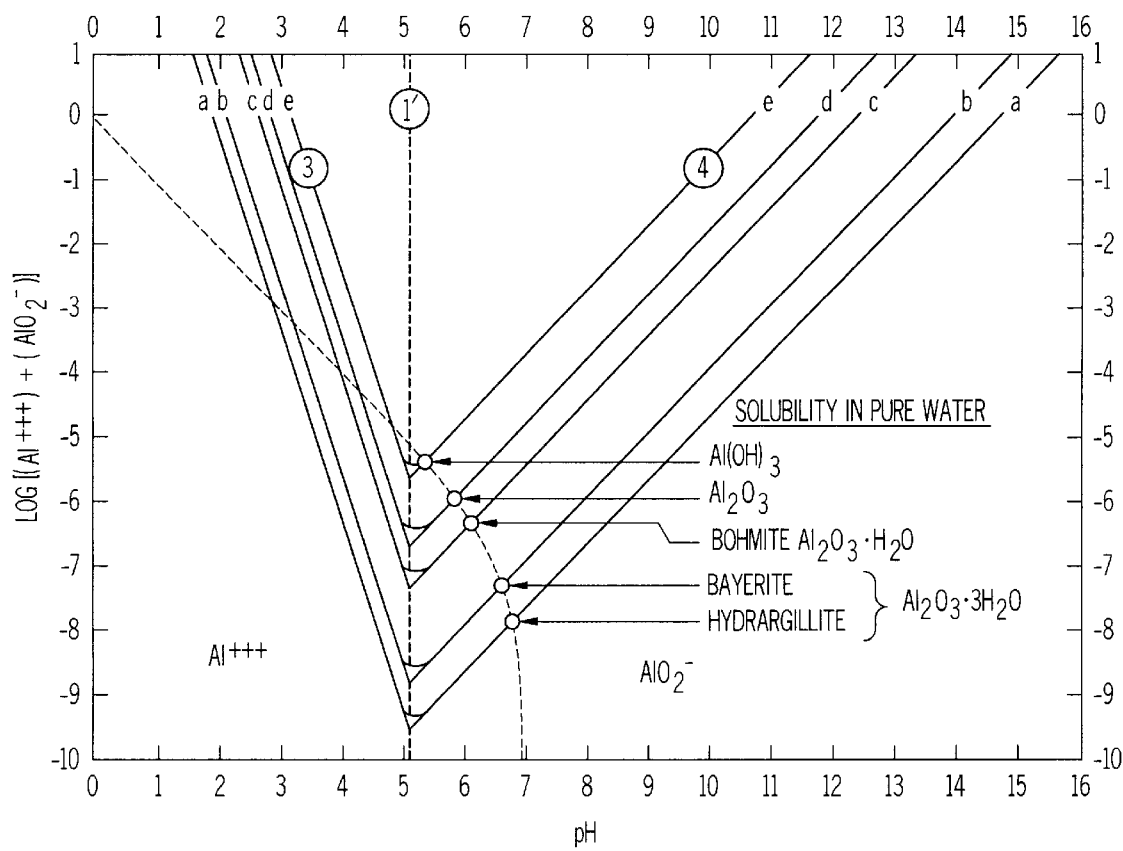
FIG. 1 is a solubility diagram for solid alumina.

In known CMP, the substrate being polished is rinsed in the slurry while an elastomeric pad is pressed against the substrate. The pad and the substrate are moved relative to each other under load (also referred to as downforce) resulting in material removal from the substrate surface due to: friction between the pad and the substrate; mechanical action of the abrasive particles resulting in wear of the substrate; and chemical interaction of other slurry constituents with the substrate. Thus, the rate of material removal from the substrate surface is determined by the applied pressure, the velocity of pad rotation, and slurry constituents. CMP is extensively used for polishing semiconductors and semiconductor devices, particularly for manufacturing integrated circuits.

The polishing rates or material removal rates are increased by adding constituents to the slurries which are corrosive to the substrate. These constituents typically comprise chemicals that are oxidizing agents, complexing agents, acids and/or bases. The combined action of the abrasive particles and the other constituents results in high polishing rates or material removal rates. For example, in CMP applications for polishing dielectric/metal composite structures, slurry constituents accelerate the wear and/or reactive dissolution of the metal portion of the structure. The purpose of this technique is to preferentially remove the metal portion of the structure so that the resulting surface becomes coplanar with an insulating or dielectric feature, typically composed of silicon dioxide. This process is termed chemical mechanical planarization.

Abrasive particles of the polishing composition of this invention include but are not limited to metal oxides such as alumina, ceria, silica, titania, germania, zirconia or combinations thereof. These metal oxides are also combined with other inert abrasives such as diamond, silicon carbide, boron carbide, boron nitride, or combinations thereof. In an embodiment, the polishing composition of this invention contains abrasive particles that are readily dispersible in an aqueous medium and comprise alpha-alumina and gamma-alumina in varying weight percentages, for example 25 and 75; 50 and 50; 100 and 0, respectively. The abrasive particles have a surface area ranging from about 40 m$^2$/g to about 430 m$^2$/g, an aggregate size distribution less than about 1.0 micron and a mean aggregate diameter less than about 0.4 micron.

Material removal rates during CMP are observed to be a function of the pH of the polishing composition. Thus, a polishing composition with a stable pH value during the shelf-life of the polishing composition is necessary for uniform material removal rates. A stable pH as defined herein is a pH value that fluctuates by less than 0.5 pH units.

Solid aluminum oxide (alumina or $Al_2O_3$) is available commercially as alpha-alumina, gamma-alumina and delta-alumina. These phases result from various steps in the dehydration sequence of hydrated aluminum oxide. Alpha-alumina is harder than gamma-alumina and is typically used to polish harder substrates such as tungsten and platinum. Commercially available alpha-alumina contains the gamma and delta phases as impurities. Since gamma-alumina dissolves more rapidly than alpha-alumina, when the polishing composition contains alumina with the dominant phase being gamma-alumina, the pH of the polishing composition changes due to rapid dissolution of gamma-alumina causing an undesirable drift in the pH of the polishing composition. Similarly, if alpha-alumina is the dominant phase in the alumina abrasive, the pH of the polishing composition gradually drifts due to slow dissolution of alpha-alumina.

In an embodiment, the polishing composition has a pH in a range of about 1.5 to 5 and contains abrasive particles comprising alumina with varying percentages of alpha-alumina and gamma-alumina. It is found that the time to attain a stable equilibrium pH value is a function of the weight percent of alpha-alumina and gamma-alumina in the abrasive. Thus, in polishing compositions containing alumina with varying percentages of alpha-alumina and gamma-alumina, pH stability is ensured through the addition of aluminum ions at molar concentrations up to 10 M. In an embodiment of this invention, dissolved aluminum(III) or $Al^{3+}$ ions are provided at an initial concentration of 1M to obtain a polishing composition with a stable pH value of about 2. The molar concentration of dissolved aluminum ions at a particular pH is determined from solubility diagrams of alumina at various pH values, as shown in FIG. 1. FIG. 1 is extracted from "FIG. 4—Influence of pH on the solubility of $Al_2O_3$ and its hydrates, at 25 C.," in the Aluminum Section of the Atlas of Electrochemical Equilibria, Marcel Pourbaix, 1966.

A polishing composition with an immediately stable pH can be obtained by adding a soluble aluminum salt, for example, aluminum chloride, aluminum nitrate, aluminium sulfate, aluminum citrate etc. to a polishing composition containing alumina as the abrasive. The desired stable pH is attained by adjusting the concentration of the soluble aluminum salt such that the $Al^{3+}$ concentration corresponds to the equilibrium solubility value of alpha-alumina shown on the Pourbaix diagram, FIG. 1. FIG. 1 is extracted from "FIG. 4—Influence of pH on the solubility of $Al_2O_3$ and its hydrates, at 25 C.," in the Aluminum Section of the Atlas of Electrochemical Equilibria, Marcel Pourbaix, 1966.

For example, gamma-alumina and/or alpha-alumina will undergo the following dissolution reaction at any pH below about 5.

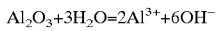

$$Al_2O_3 + 3H_2O = 2Al^{3+} + 6OH^-$$

The generation of $OH^-$ ions during this dissolution reaction causes the pH to drift to higher values. Thus, in a polishing composition with a pH of 2, the presence of alpha-alumina and/or gamma-alumina will cause the pH to drift upward to the point where an equilibrium is reached between the pH and the amount of $Al^{3+}$ ions in solution.

At a pH greater than 5, the following reaction needs to be in equilibrium.

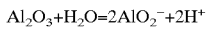

$$Al_2O_3 + H_2O = 2AlO_2^- + 2H^+$$

The generation of $H^+$ ions during this dissolution reaction of alpha-alumina and/or gamma-alumina causes the pH to drift to lower values.

FIG. 1 discloses graphs representing solubility versus pH for different materials. The graphs, indicated at a, b, c, d and e, represent solubility versus pH for the materials, Hydrargillite, Bayerite, Bohmite, $Al_2O_3$ and $Al(OH)_3$, respectively. Each of the graphs has a corresponding apex at about 5 pH. A broken line 1' indicates that each apex occurs at about 5 pH. The graph, e, has branches, indicated at 3 and 4, respectively, extending from a corresponding apex.

As indicated by FIG. 1, as the pH moves further away from a value of 5, the amount of $Al^{3+}$ ions needed to be in equilibrium with alumina or $Al_2O_3$ increases logarithmically. The pH drift stops once the system reaches equilibrium between the amount of dissolved aluminum ions or aluminate ions and the amount of acid or base in the solution, respectively. The time to equilibrium is short (order of hours) with pure gamma-alumina (due to the higher solubility rate of gamma-alumina) or more than a month where the alumina comprises primarily alpha-alumina. The time to equilibrium increases in proportion to the weight percentage of alpha-alumina in the alumina abrasive particles due to the slow dissolution rate of alpha-alumina.

In an embodiment, the pH-stable polishing composition according to this invention also contains an oxidizing agent. Useful oxidizing agents include any water-soluble composition capable of receiving an electron from the metal atoms at the surface of the substrate during the polishing operation. By receiving electrons from the metal surface of the substrate, the oxidizing agent can transform metal atoms at the substrate surface into water soluble cations. Thus, the oxidizing agent promotes metal dissolution. Typical oxidizing agents include: nitrates, sulfates, persulfates, iodates, periodates, peroxides and/or acid derivatives thereof. Oxidizing agents when added to polishing compositions used for CMP convert the metal in the substrate surface to an oxide which is then subject to the chemical and mechanical action of the polishing composition. A general review of this art is provided by F. B. Kaufman et al., "Chemical-Mechanical Polishing for Fabricating Patterned W Metal Features as Chip Interconnects," J. Electrochem. Soc., Vol. 138, No. 11, November 1991, pp. 3460–3464, 1991.

In an embodiment, polishing compositions according to the present invention also comprise complexing agents which include compounds having at least two acid moieties present in the structure which can effect complexation with the target metal in the substrate being polished. Acid moieties are defined as those functional groups having a dissociable proton. These include, but are not limited to carboxyl, hydroxyl, sulfonic and phosphonic groups. In an embodiment, the complexing agent has two or more carboxyl groups with hydroxyl groups in an alpha position, such as straight chain mono- and di-carboxylic acids and salts thereof including, for example, malic acid, tartaric acid and gluconic acid and their respective salts. Tri- and polycarboxylic acids and salts thereof with secondary or tertiary hydroxyl groups in an alpha position relative to a carboxylic group are also used, for example citric acid and its salts. Examples of other compounds include ortho, di- and polyhydroxybenzoic acid and their salts such as phthalic acid and phthalates, pyrocatechol, pyrogallol, gallic acid and gallates, tannic acid and tannates. In an embodiment, the complexing agent used in the polishing composition of this invention tends to complex with metal anions, forming a 5 or 6 member ring, whereby the metal atom forms a portion of the ring.

A method is also provided for chemical-mechanical polishing of semiconductor substrates with the polishing composition of this invention comprising: water, high purity submicron metal oxide particles and a soluble salt of the metal oxide present at a concentration corresponding to the equilibrium solubility of the metal oxide at the pH of the polishing composition. In chemical-mechanical polishing of semiconductor substrates, the substrate is pressed against a polishing pad and a polishing slurry is provided at the interface between the substrate and the pad while the pad and the substrate are moved relative to each other under pressure. Polishing pressure or downforce controls the polishing rate or the material removal rate. A higher downforce results in a faster polishing rate while a lower downforce yields a polished surface of better quality since the abrasive particles in the slurry do not scratch the substrate surface to the same extent at lower downforce values as at higher downforce values. During CMP, the substrate (for e.g. glass disks, semiconductor wafers, multi-chip modules or printed circuit boards) to be polished is mounted on a carrier or polishing head of the polishing apparatus. The exposed surface of the substrate is placed against a rotating polishing pad. The carrier head provides a controllable pressure (or downforce), on the substrate to push it against the polishing pad. A polishing composition with abrasive particles is then dispensed at the interface of the substrate and the polishing pad to enhance removal of the target layer (for e.g., metal in metal CMP processes). Typical downforce values are in a range of about 0.7 kPa to about 70 kPa.

EXAMPLE 1

This example illustrates the long time to equilibrium of a polishing composition containing alumina, comprising primarily of alpha-alumina, as the abrasive.

Figure 2:
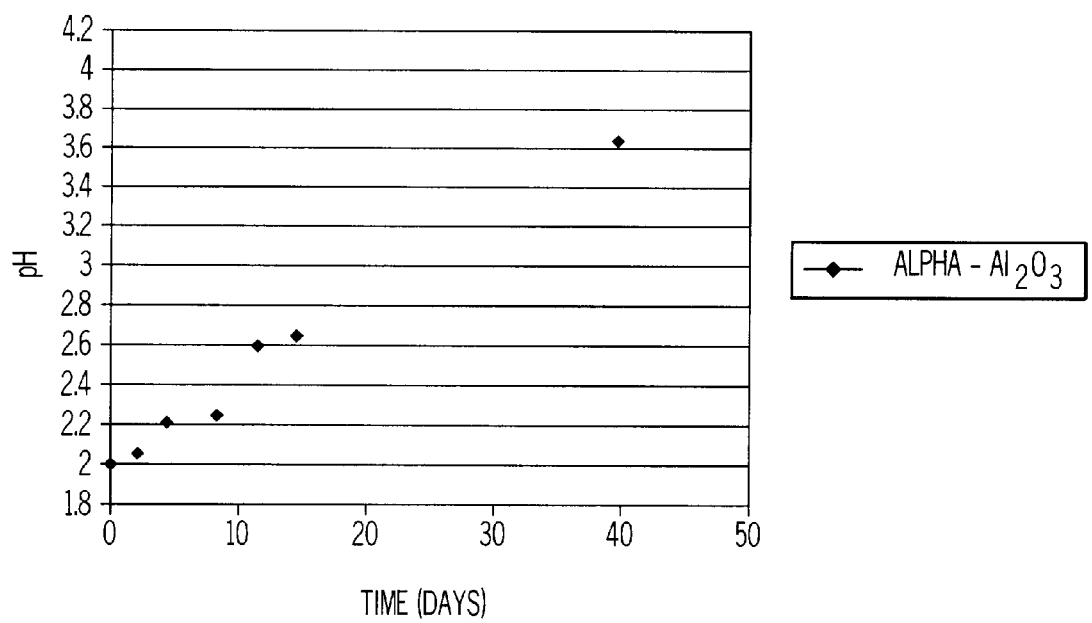
FIG. 2 is a graph of pH versus time for an aqueous dispersion of alpha-alumina.

Alpha-phase alumina was mixed with deionized water to obtain an aqueous dispersion with an alumina content of 5%. A dispersant was then added to ensure that the particles did not agglomerate. The pH of the dispersion was then adjusted to a value of about 2.0 using nitric acid and monitored on a regular basis for a period of 3 weeks. As shown in FIG. 2, the pH of the dispersion increased from an initial pH of 2.0 to 3.7, during the observation period of about 40 days.

EXAMPLE 2

This example illustrates the effect of addition of $Al^{3+}$ ions to a polishing composition to obtain a stable pH. Aluminum chloride was used to adjust the concentration of $Al^{3+}$ ions in the aqueous phase.

Figure 3:
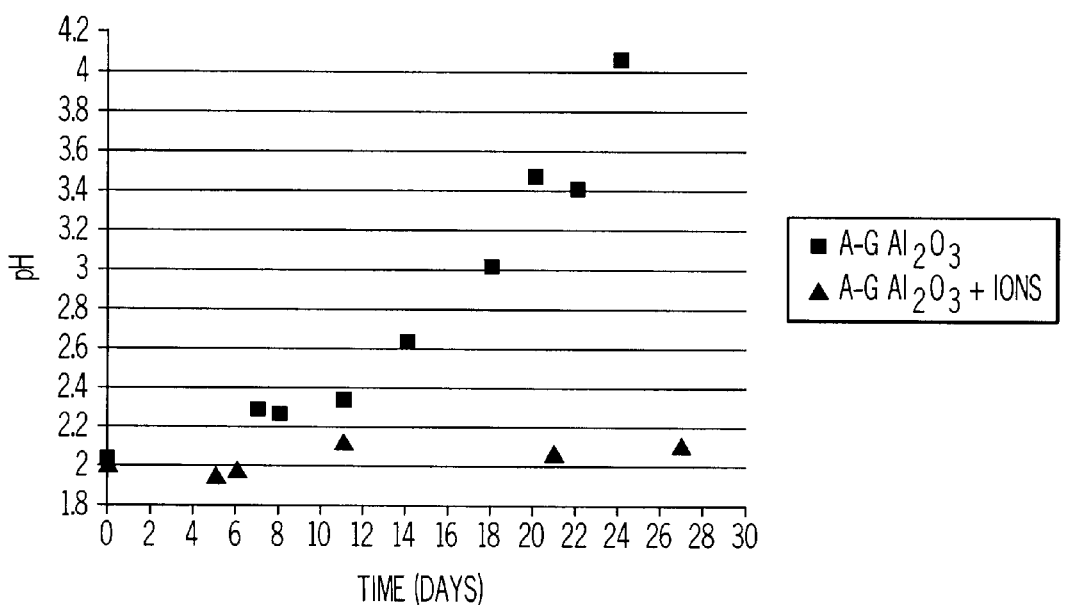
FIG. 3 is a graph of pH versus time for an aqueous dispersion of alumina comprising alpha-alumina and gamma-alumina phases.

A polishing composition according to this invention was formulated with alumina containing both gamma-alumina and alpha-alumina. All other conditions were identical to those of Example 1. Since gamma-alumina is more soluble than alpha-alumina, the pH drift observed during this experiment was more noticeable than in Example 1, where the abrasive particles contained only alpha-alumina. As shown in FIG. 3, when the slurry contains an equilibrium concentration of $Al^{3+}$ ions (corresponding to the solubility of gamma-alumina at the initial pH of 2), the pH of the polishing composition is stable.

EXAMPLE 3

Most other inorganic oxides such as silica, titania, and zirconia behave like alumina in aqueous solution. For example, silica ($SiO_2$) dissolves at a pH above 9. Addition of a silicate salt in a composition containing silica as the abrasive will control dissolution of the abrasive and any associated pH drift.

What is claimed is:

1. In an aqueous polishing composition of a pH, said composition having abrasive particles of a metal oxide providing ions upon dissolution, the improvement comprising: a soluble salt providing an equilibrium concentration of said ions at the pH, which avoids drift of the pH caused by dissolution of the particles.

2. In the aqueous polishing composition as recited in claim 1, wherein said ions are metal ions.

3. In the aqueous polishing composition as recited in claim 1, wherein the pH is greater than 5, and said ions are metal ions.

4. In the aqueous polishing composition as recited in claim 1, wherein the particles are alumina, and said ions are ions of an aluminum oxide.

5. In the aqueous polishing composition as recited in claim 1, wherein the pH is less than 5, and said ions are metal ions.

6. In the aqueous polishing composition as recited in claim 1, wherein the particles are alumina, and said ions are metal ions of aluminum.

7. In the aqueous polishing composition as recited in claim 1, wherein the particles are alumina, and the soluble salt is aluminum salt.

8. In the aqueous polishing composition as recited in claim 1, wherein the particles are alumina, and the soluble salt is an aluminum salt when the pH is about 1.5 to 5.

9. In a method of chemical mechanical polishing wherein, an interface of a polishing pad and a substrate being polished by the polishing pad receives an aqueous polishing composition having particles of a metal oxide providing ions upon dissolution, the improvement comprising the step of: providing an equilibrium concentration of said ions at a pH of the aqueous polishing composition, which avoids drift of the pH caused by dissolution of the particles.

10. In the method as recited in claim 9, wherein said ions are metal ions and the pH is greater than 5.

11. In the method as recited in claim 9, wherein said ions are metal ions and the pH is greater than 5, and the particles comprise alumina.

12. In the method as recited in claim 9, wherein said ions are metal ions and the pH is less than 5.

13. In the method as recited in claim 9, wherein said ions are metal ions and the pH is less than 5, and the particles comprise alumina.

14. In the method as recited in claim 9, wherein the aqueous polishing composition with a soluble salt provides said equilibrium concentration of said ions at the pH.

* * * * *